United States Patent
Schöneberg et al.

(10) Patent No.: US 12,493,238 B2
(45) Date of Patent: Dec. 9, 2025

(54) METHOD, DEVICE AND COMPUTER PROGRAM FOR REPAIRING A MASK DEFECT

(71) Applicant: Carl Zeiss SMT GmbH, Oberkochen (DE)

(72) Inventors: Johannes Schöneberg, Darmstadt (DE); Michael Budach, Hanau (DE); Christof Baur, Darmstadt (DE); Jens Oster, Ober-Ramstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 345 days.

(21) Appl. No.: 17/703,457

(22) Filed: Mar. 24, 2022

(65) Prior Publication Data
US 2022/0308443 A1  Sep. 29, 2022

(30) Foreign Application Priority Data
Mar. 26, 2021 (DE) .......................... 102021203075.0

(51) Int. Cl.
G03F 1/74 (2012.01)
(52) U.S. Cl.
CPC ..................................... G03F 1/74 (2013.01)
(58) Field of Classification Search
CPC ....................................................... G03F 1/74
See application file for complete search history.

(56) References Cited

U.S. PATENT DOCUMENTS 6,139,993 A * 10/2000 Lee ........................... G03F 1/74
430/5
6,322,935 B1 * 11/2001 Smith ....................... G03F 1/30
430/5

(Continued)

FOREIGN PATENT DOCUMENTS

CN 1770008 5/2006
CN 103703415 4/2014

(Continued)

OTHER PUBLICATIONS

The Office Action issued by the German Patent Office for Application No. DE 10 2021 203 075.0, dated Oct. 1, 2021 (With English Machine Translation).

(Continued)

Primary Examiner — Jonathan Johnson
Assistant Examiner — Jayson D Cosgrove
(74) Attorney, Agent, or Firm — Fish & Richardson P.C.

(57) ABSTRACT

A method, a device and a computer program for repairing a defect of a mask for lithography, in particular an EUV mask, are described.
A method of repairing a defect of a mask for lithography, in particular an EUV mask, comprises the following steps: (a.) carrying out a first repair step on the defect using a first repair dose, wherein the defect transitions from an initial topology to a first defect topology as a result; (b.) determining an influence of the first repair step on the topology of the defect; (c.) determining a second defect topology for the defect, which is intended to be achieved by way of a second repair step on the defect; and (d.) determining a second repair dose for the second repair step, at least in part on the basis of the determined influence of the first repair step on the topology of the defect and the second defect topology.

(Continued)

The method may further comprise step (e.) of carrying out the second repair step using the second repair dose.

32 Claims, 2 Drawing Sheets

(56) References Cited

U.S. PATENT DOCUMENTS

| | | | |
|---|---|---|---|
| 6,593,040 | B2 | 7/2003 | Smith |
| 7,927,770 | B2 | 4/2011 | Kanamitsu |
| 2001/0038954 | A1 | 11/2001 | Smith |
| 2005/0146715 | A1 | 7/2005 | Lin et al. |
| 2006/0093924 | A1 | 5/2006 | Adkisson et al. |
| 2006/0147814 | A1 | 7/2006 | Liang |
| 2011/0189593 | A1* | 8/2011 | Ogawa ............... G03F 1/24 118/712 |
| 2014/0165236 | A1 | 6/2014 | Budach et al. |
| 2017/0248842 | A1 | 8/2017 | Oster et al. |
| 2019/0302604 | A1* | 10/2019 | Horigome ............ G03F 1/32 |
| 2020/0310245 | A1 | 10/2020 | Kozakai et al. |
| 2020/0310246 | A1* | 10/2020 | Nakagawa ........... H01J 37/304 |

FOREIGN PATENT DOCUMENTS

| | | |
|---|---|---|
| CN | 108073035 | 5/2018 |
| CN | 105511222 B | 11/2019 |
| CN | 111435218 | 7/2020 |
| CN | 111736424 | 10/2020 |
| DE | 102016203094 | 8/2017 |
| JP | 2000-306539 | 11/2000 |
| JP | 2000-347385 | 12/2000 |
| JP | 2004-287321 | 10/2004 |
| JP | 2010-109164 | 5/2010 |
| JP | 2018-072665 | 5/2018 |
| JP | 2020-160187 | 10/2020 |
| TW | I439798 | 6/2014 |
| TW | 202043912 | 12/2020 |

OTHER PUBLICATIONS

The Office Action and Search Report issued by Taiwan Patent Office for Application No. TW 111111174, dated Dec. 6, 2022 (with English Translation of portions of the office action).

The Notification of Grounds for Refusal issued by the Japanese Patent Office for Application No. JP 2022-052310, dated Apr. 20, 2023 (with English Translation).

The Office Action issued by the Japanese Patent Office for Application No. JP 2022-052210, dated Dec. 25, 2023 (English Translation Only).

The Office Action issued by the German Patent Office for Application No. DE 10 2021 203 075.0, dated Feb. 12, 2024 (with English Machine Translation).

The Office Action issued by the Korean Patent Office for Application No. KR 10-2022-0037170, dated Aug. 13, 2024 (English Translation Only).

The Office Action issued by the Chinese Patent Office for Application No. CN 202210311424.4, dated Oct. 14, 2024 (With English Translation).

* cited by examiner

METHOD, DEVICE AND COMPUTER PROGRAM FOR REPAIRING A MASK DEFECT

CROSS REFERENCE TO RELATED APPLICATIONS

This application claims priority under 35 U.S.C. § 119 from German Application No. 10 2021 203 075.0, filed on Mar. 26, 2021, the entire contents of which are incorporated herein by reference.

TECHNICAL FIELD

The present invention relates to a method, a device and a computer program for repairing a defect of a mask for lithography, in particular a defect of a mask for EUV lithography (abbreviated "EUV mask" hereinafter).

BACKGROUND

As a consequence of the steady increase in integration density in microelectronics, lithography masks (often just "masks" for short hereinafter) have to image ever smaller structure elements into a photoresist layer of a wafer. In order to meet these requirements, the exposure wavelength is being shifted to ever shorter wavelengths. At the present time, argon fluoride (ArF) excimer lasers are principally used for exposure purposes, these lasers emitting at a wavelength of 193 nm. Intensive work is being done on light sources which emit in the extreme ultraviolet (EUV) wavelength range (10 nm to 15 nm), and corresponding EUV masks. The resolution capability of wafer exposure processes has been increased by simultaneous development of multiple variants of conventional binary lithography masks. Examples thereof are phase masks or phase-shifting masks and masks for multiple exposure.

On account of the ever decreasing dimensions of the structure elements, lithography masks cannot always be produced without defects that are printable or visible on a wafer. Owing to the costly production of masks, defective masks are repaired whenever possible.

Two important groups of defects of lithographic masks are, firstly, dark defects and, secondly, clear defects.

Dark defects are locations at which absorber or phase shifting material is present, but which should be free of this material. These defects are repaired by removing the excess material preferably with the aid of a local etching process.

By contrast, clear defects are defects on the mask which, on optical exposure in a wafer stepper or wafer scanner, have greater transmittance than an identical defect-free reference position. In mask repair processes, such clear defects can be eliminated by depositing a material having suitable optical properties. Ideally, the optical properties of the material used for the repair should correspond to those of the absorber or phase shifting material.

The applicant develops and produces measuring apparatuses for analyzing lithographic masks. The applicant further develops and markets repair devices for lithographic masks.

A known method of removing dark defects is to use an electron beam directed directly at the defect to be repaired. On account of the use of an electron beam, in particular, precise steering and positioning of the beam onto the defect is possible. In conjunction with a precursor gas, also called process gas, which may be guided into the atmosphere of the mask to be repaired, it is possible to induce a reaction akin to a local etching operation by virtue of the incident electron beam. This induced local etching operation can remove fractions of excess material (of the defect) from a mask, such that the absorber properties and/or phase-shifting properties desired for the lithography mask can be generated or restored.

Alternatively, it is also possible to choose the precursor gas used such that a deposition process can be induced on irradiation with the beam. As a result, it is possible to deposit additional material on clear defects in order to locally reduce the transmittance of the mask and/or to increase the phase-shifting properties.

A possible method for repairing phase-shifting defects in a photomask is described in document U.S. Pat. No. 6,593,040 B2, for example. The method comprises scanning the mask for defects and determining the position of at least one defect. The defect is subsequently analyzed in three dimensions and the result of the analysis is used to direct a focused ion beam (FIB) at the defect in order to remove the latter. The FIB is controlled by an etching map generated on the basis of the results of the three-dimensional analysis. Further, test patterns can be generated using the FIB and can be analyzed in three dimensions, and are subsequently used to generate the etching map.

However, a disadvantage of some of the known methods is that these for example do not at all consider the dynamics of the repair process, or only consider this to an insufficient extent. For example, the three-dimensional analysis is only carried out once, before carrying out the etching process, in the aforementioned method. However, the manner in which a defect reacts to the currently occurring repair measures, for example, may change during the repair process. However, this may lead to the repair steps calculated in advance not leading to the expected results when the method is carried out, and the repair success, as desired, therefore does not occur (or there may even be damage to the mask).

The present invention is therefore based on the object of specifying a method which at least reduces or eliminates these disadvantages of some of the known methods and/or permits a more accurate and reliable repair of mask defects. Furthermore, a corresponding device and a computer program with instructions for carrying out such a method are intended to be provided.

SUMMARY

The aforementioned objects are at least partly achieved by the various aspects of the present invention, as described below.

In an embodiment, a method of repairing a defect of a mask for lithography, in particular an EUV mask, comprises the following steps: (a.) carrying out a first repair step on the defect using a first repair dose, wherein the defect transitions from an initial topology to a first defect topology as a result, (b.) determining an influence of the first repair step on the topology of the defect, (c.) determining a second defect topology for the defect, which is intended to be achieved by way of a second repair step on the defect, and (d.) determining a second repair dose for the second repair step, at least in part on the basis of the determined influence of the first repair step on the topology of the defect and the second (intended) defect topology.

During the mask processing, in particular mask repair, one or more gases are typically guided to an intended reaction location and are made to react there by being irradiated with a beam of energetic particles (for example, photons, electrons or ions) in order thus to carry out the intended processing processes (e.g. an etching process or deposition process, as already indicated at the outset and still described in more detail below). In this case, the introduced repair dose has an influence on the course of the respective repair step.

According to the present method, a first repair step using a first repair dose is initially carried out on the defect to be repaired (for example a clear or dark defect, as mentioned the outset). The defect alters in the process, in particular the defect transitions from an initial topology into a new topology which is referred to here as first defect topology.

In the simplest case, the topology in this case is merely described by an individual characteristic or a few characteristics, for example a height of the defect. As still described in more detail hereinafter, the topology of the defect may be described and characterized with more detail within the scope of the present method, for example by way of a position-dependent height of the defect, the latter's lateral extent, the latter's three-dimensional structure, etc., which may increase the accuracy of the mask repair.

According to the method described, the effect of the first repair step on the defect is determined following the implementation of said first repair step. In particular, it is possible to determine how the topology of the defect has changed as a result of implementing the first repair step, or what influence the first repair step had on the topology of the defect. In this case, the topology of the defect or its change can be determined in a manner known in principle to a person skilled in the art, for example by using a scanning probe microscope, in particular an atomic force microscope, a profilometer or any other suitable device (see below). In principle, interferometric measuring processes are also conceivable, although these typically do not have a sufficient lateral resolution.

This step is based on the discovery that in general many factors that can influence the result of a repair step given a specific repair dose play a role when repairing defects on masks, and the exact behaviour of the defect is therefore not always precisely predictable. Or, conversely, the repair dose required for a certain repair success depends in general on a plurality of (defect) parameters, which need not necessarily be known in full at all times. In addition to the topology of the defect itself, these may be for example the properties of the vicinity of the defect on the mask (for example, regions of the defect adjoining the absorber material of the mask may behave differently to regions adjoining the quartz material of the mask), the relative position of the defect on the photomask (for example, a region with much quartz material behaves differently to a region with much absorber material, and significantly structured regions may behave differently to regions with little structure) or the electric charge and/or temperature of the mask surface. Especially in the case of defects that need to be removed, the material composition of the defect may also play a role, which either may already be caused intrinsically by the mask type itself (for example, different materials and/or material layers, of which the mask consists) or else may be influenced by contaminations or impurities on the mask or the defect.

Moreover, all these factors may change during the mask repair, and hence the required repair dose may also change (in a manner not predictable at the outset) during the process. Therefore, the repair dose must be chosen and adjusted while the mask repair process is carried out so that the defect is repaired as desired and damage to the photomask is minimized. According to the present method, the defect is therefore not repaired in a single step, for which a required repair dose was determined in advance, but rather the influence of the first repair step on the topology of the defect is initially determined after said first repair step has been carried out, and information that is used for controlling the further mask repair process is obtained therefrom.

More precisely, a second defect topology that is intended to be obtained using a second repair step on the mask is initially determined following the determination of the influence of the first repair step on the topology of the defect. As still explained in more detail hereinafter, the second defect topology may already be the end topology to be obtained (that is to say, the desired repair success), or else the second defect topology in turn represents an intermediate goal of the method and the method comprises further iterations of the procedure described herein until the desired end result is reached. In this case, the second defect topology to be obtained can be determined automatically or else with manual input. Mixed forms are also possible. Even before the method has started, a second defect topology or a sequence of defect topologies (should the method run iteratively; cf. below), which may have emerged from empirical values obtained from the repair of equivalent or similar defects for example, may have been specified, which are then intended to be achieved by the method in sequence.

After the second defect topology, which is intended to be obtained by the subsequent, second repair step, has been defined, the repair dose required to this end is determined taking into account the influence of the first repair step on the topology of the defect and the second defect topology to be obtained. Further factors that have an influence on the course of the second repair step, for example the aforementioned factors, may naturally also be considered at this point.

Thus, determining the repair dose required for the second repair step is implemented taking account of the information obtained from the first repair step such that, according to the method present, a dynamic adaptation of the mask repair process to the possibly changing conditions, to (changing) properties of the defect currently being processed or to other (uncontrolled and/or uncontrollable) process parameters is rendered possible.

The method may then additionally comprise step (e.) of carrying out the second repair step using the second repair dose.

As a result of carrying out this second repair step, the topology of the defect will change again. In the ideal case, the topology obtained thus corresponds to the topology specified as the goal for the second repair step, the second repair dose having been determined taking this into account. However, various factors may lead to the topology of the defect following the implementation of the second repair step not exactly corresponding to the sought-after topology. Should the topology generated by the second repair step not only have been provided as an intermediate goal of the method in any case, further repair measures may then still be required in this case in order to obtain the desired repair result. However, in any case, following the implementation of the second repair step, the defect will have a topology which is referred to as the second (actual) defect topology hereinafter.

Thus, what emerges from the explanations above is that the first repair step can be carried out as a calibration step in particular. By way of example to avoid damage to the mask, for example as a result of an unpredictably "aggressive" course of the first repair step, the first repair step may be implemented as a calibration step in particular, within the scope of which less than 50%, preferably less than 30%, particularly preferably less than 15% of a desired final repair success are obtained or are intended to be obtained. In most cases, the desired final repair success here will represent the complete removal of the defect from the mask, but other cases are also conceivable and also encompassed.

In particular, the repair dose for the first repair step may be chosen (optionally depending on position) in such a way that these aforementioned percentage values are not exceeded. If in doubt, a rather more "conservative" value for the repair dose for the first repair step will be decided upon, since this is the most likely course of action to avoid damage to the mask (for example as a result of excessive etching).

Alternatively, a first repair dose which targets obtaining more than 50% of a desired final repair success may also be determined for the first repair step. This can minimize the number of subsequent iterations, and hence the entire process duration. At the same time, it is possible to react to possible deviations by way of one or more second steps. By way of example, the choice of the first repair dose in this case may have been determined empirically from similar repairs.

As already indicated, step (b.) of determining the influence of the first repair step on the topology of the defect may comprise a determination of a change in the topology of the defect which is caused by the implementation of the first repair step. In particular, the step may contain a comparison of the first defect topology with the initial topology.

If necessary, this may comprise the initial topology initially being determined before the first repair step is carried out.

Within the scope of the present method, the change in the topology of the defect may be specified and considered here in different degrees of detail as a matter of principle. As already mentioned at the outset, the topology may be described for example merely by a value for the height/thickness of the defect (for example, a height/thickness averaged over the surface area of the defect, or a maximum height/thickness of the defect, or minimal height/thickness of the defect) and the change in the topology can accordingly be characterized merely by a change in the height/thickness of the defect in this simple case. However, far more detailed information about the change in topology can be determined by a comparison between the first defect topology and the initial topology. More accurate information obtained thus will in general also allow the second repair dose to be determined more accurately (possibly even in position-dependent fashion; cf. hereinafter), which second repair dose is required to obtain the sought-after second defect topology. However, this may increase the analysis complexity of the method, and so this has to be, or may have to be, weighed up.

Step (b.) of determining the influence of the first repair step on the topology of the defect may comprise, in particular, determining a first process speed of the first repair step, at least in part on the basis of the determined change in the topology of the defect and the first repair dose.

With knowledge of the first repair dose, the determined change in the topology of the defect can thus be used to find out how quickly the first repair step changes the topology of the defect and for example removes or deposits material. By way of example, for an etching process, it is therefore possible to determine how strongly the implemented first repair step etches away the material of the defect using the first repair dose. For a deposition process, it is possible to determine how quickly or how much material is deposited on the mask by the implemented first repair step using the first repair dose. This information can then be used to determine "how much is left to do," and consequently be incorporated in the determination of the second repair dose. Since the first process speed of the first repair step was determined in relation to the defect currently being processed, it is consequently able to automatically also consider the aforementioned further factors which may influence the process speed, allowing a particularly accurate and also "dynamic" control of the further course of the process.

In particular, the topology of the defect may comprise a height of the defect dependent on a position on the mask.

Such a "height map" of the defect for example also allows the repair dose for the further repair step or steps to be determined in spatially resolved fashion as it provides spatially resolved information about the influence of the first repair step (or further iteratively carried out repair steps) on the defect and consequently permits a spatially dependent calibration of the process.

By way of example, the topology of the defect may further comprise one or more of the following information items: a lateral extent of the defect, a three-dimensional structure of the defect.

As already mentioned, the inclusion of further properties or information about the topology of the defect will generally permit even more accurate control of the process, but also increase its complexity and resource consumption, and so it is possible or necessary to find a compromise between complexity and accuracy of the method in this case.

Step (d.) of determining the second repair dose for the second repair step may take account of one or more calibration curves for different defect types, which curves allow a repair behaviour of the defect to be estimated.

Beyond the "dynamic" calibration of the method on the basis of the change in topology of the defect currently being processed (often referred to as "current defect" for short hereinafter), the present method can also use reference data/calibration curves in order to further increase the accuracy of the method and/or its speed. By way of example, these calibration curves can be used to adjust the repair dose for the further repair step or steps such that the desired process speed is attained. By way of example, the change in topology experienced by the current defect during the first repair step can be compared to one or more calibration curves for a defect type which corresponds to the current defect or is similar thereto, in order thus to ascertain by comparison whether the current repair process is behaving as expected or deviates from the reference values. In the latter case, the calibration data from curves can be taken into account when determining the second repair dose of the second repair step, for example the determined actual influence of the first repair step on the topology of the defect can be averaged with values from the calibration curves or a deviation from the expected behaviour can be determined and the size of this deviation is then also considered when determining the second repair dose (e.g. as a correction factor for the second repair dose initially determined without taking account of the calibration curves). A weighted sum of the determined actual influence and one or more values from the one or more calibration curves may also be taken into account. Further, such stored reference data may also be used to save intermediate steps, that is to say to be able to reach the desired end topology quicker than optionally might be possible if it were necessary to "cautiously approach" the desired repair result "blind."

In this case, the one or more calibration curves might have been created manually or automatically during the current iteration and/or one or more previous iterations of the method.

The calibration curves created in one or more preceding iterations of the method may be stored in a database, for example, which can be accessed during the current iteration of the method. Naturally, other methods of data storage are also possible. Particularly if the method runs through iteratively, as is yet to be described in more detail below, it is however also possible that the calibration curves have grown from previous steps of this iteration process in the current repair process, and are therefore able to map the properties and characteristics of the current repair process particularly well.

Moreover, the method can be executed as follows for a defect comprising a plurality of material layers: The first repair step using the first repair dose can be carried out on a first material layer which includes a first material, and the second repair step using the second repair dose can be carried out on a second material layer which includes a second material that differs from the first material. Moreover, the first process speed of the first repair step can be determined in relation to the first material, and the determination of the second repair dose can further include taking account of a thickness of the second material layer and a process selectivity of the second repair step on the second material in relation to the first repair step on the first material.

In this case, taking account of the thickness of the second material layer when determining the second repair dose is optional, that is to say the option explained here can also find use without the inclusion of the thickness of the second material layer as a relevant factor as a matter of principle.

In any case, the first repair step on the first material layer which contains the first material can be used to extrapolate the behaviour and the effects of the repair process on the second material layer, and consequently to determine and choose a suitable second repair dose for processing this second material layer in the second repair step. In this case, the process selectivity in particular of the reaction (e.g. etching process or deposition process) taking place in respect of the first and second material plays a role, for example the process speed or process rate with which the repair process runs under otherwise the same conditions in respect of the first and second material.

If the process selectivity in respect of the various materials is not known, it may have been determined from the repair process itself during the current iteration of the method and/or one or more preceding iterations of the method. By way of example, the second repair step thus can initially be preceded by a further step in which the second material layer "is tested" (e.g. a processing step with a low repair dose but of the same type as the second repair step to be carried out) and hence the process selectivity in respect of the second material is determined, before the actual repair is then continued with the second repair step.

As already mentioned, the second defect topology may already represent a desired end topology. That is to say, it is possible that the present method already obtains the desired repair success with the completion of the second repair step (or at least comes very close to this repair success), which can be made possible, in particular, as a result of the fact that the second repair step was calibrated using the current defect itself, specifically by determining the influence that the first repair step had on the topology of the defect.

However, it is in particular also possible that the second defect topology merely represents an intermediate goal of the method and, within the scope of the method, steps (b.) to (e.) are run through iteratively until the desired end topology of the defect is obtained.

That is to say, after the second repair step has been carried out using the second repair dose, an influence of the second repair step on the topology of the defect is determined (and/or an averaged or weighted influence of the first and second repair step), whereupon a third defect topology is defined for the defect, said third defect topology intending to be obtained using a third repair step on the defect, and a third repair dose for the third repair step is determined at least partly on the basis of the determined influence of the second repair step on the topology of the defect (and/or on the basis of the aforementioned averaged or weighted influence) and the third defect topology. Thereupon, it is possible to carry out the third repair step using the third repair dose.

In general, following the implementation of the i-th repair step using the i-th repair dose, it is possible to determine an influence of the i-th repair step on the topology of the defect, then define an i+1-th defect topology for the defect that is intended to be obtained on the defect with the i+1-th repair step, determine an i+1-th repair dose for the i+1-th repair step, at least partly on the basis of the determined influence of the i-th repair step on the topology of the defect and the i+1-th defect topology, and carry out the i+1-th repair step using the i+1-th repair dose, etc.

When determining the i+1-th repair dose for the i+1-th repair step, it is possible to use the information and discoveries—i.e. the "calibration input"—from the i-th iteration just run through previously, and also the calibration input from one or more iterations further back (i.e. from the i−1-th iteration and/or the i−2-th iteration and/or the i−3-th iteration, etc., if present), and so the considered calibration input can increase with each iteration. By way of example, the input from the various iterations can be averaged or weighted according to "currentness."

Verification of the end topology obtained may likewise be part of the method.

By way of example, this verification may comprise a check as to whether the defect topology arising from the just preceding repair step in fact corresponds to the topology specified as the goal for the repair step. The method can be considered complete should this be the case; further iterations may optionally be required if this is not the case.

The first repair dose and/or the second repair dose may vary dependent on position in this case. The same applies to a third repair dose and/or fourth repair dose, etc., possibly encompassed by the method in the case of an iterative course of said method.

As a result of the position-dependent variation of the repair dose or repair doses, it is possible to control the processing of the defect with pinpoint accuracy and thus it is possible to remove or deposit only so much material at each location of the defect as is required to obtain the sought-after defect topology after the completion of the repair process.

The first repair step and/or the second repair step may comprise an etching process and/or deposition process. The same applies to a third repair step and/or fourth repair step, etc., possibly encompassed by the method in the case of an iterative course of the method.

As already mentioned at the outset, mask defects can typically be classified as one of two types, specifically defects in which excess absorber material is present at locations where this should not be the case, or else defects where conversely there is a lack of absorber material. Respective typical repair measures, specifically the removal of the excess material, in particular by etching the material away, or else the deposition of absorber material at locations where it is lacking, correspond to these two types of defects.

In particular, the first process speed can be determined in position-dependent fashion. The same applies to a second process speed and/or third process speed, etc., possibly encompassed by the method in the case of an iterative course of the method.

In particular, as described above, this can be used to determine a position-dependent repair dose for the next repair step such that the latter can be controlled with pinpoint accuracy such that the intended defect topology can be attained as accurately as possible. For the position-dependent determination of the process speed, there can generally be a position-dependent detection of the change in the topology at least in the just preceding repair step, but position-resolved information from iterations further back (if present) may also find use.

It is advantageous if the method proceeds under unchanging external conditions, in particular in a vacuum.

To be precise, should this not be the case, for example like in methods known from the prior art, within the scope of which one or more intermediate checks of the repair progress may be possible but the mask being processed has to be taken out of the processing environment to this end in order to be supplied to an analysis tool, the mask surface and, in particular, the defect surface or composition of the defect may change during such an analysis, for example as a result of oxidation processes, and so the information obtained before or during the analysis may already be out of date upon resumption of the repair process and no longer correctly reflect the conditions present then. By contrast, the present method may occur under unchanging conditions, in particular in vacuo, such that those effects which may lead to errors and inaccuracies of the repair process can be avoided.

In particular, the method can run on a combined repaired and analysis device.

This is accompanied by the just mentioned option of allowing the method to run under unchanging conditions and promotes such a method sequence since the mask need not be removed from the device and, e.g. supplied to a separate analysis device. Moreover, this may simplify and accelerate the repair process.

For example, the combined repair and analysis device may be formed by a combination of a repair system marketed by the applicant with an atomic force microscope.

Should the defect correspond to a known defect type for which one or more calibration curves are known, the method may also comprise using a repair behaviour of the defect to draw conclusions about a stability of the method and/or a stability of a device on which the method runs.

In this case, the conclusions may be drawn taking account of the calibration curves.

It was already mentioned and explained further above how stored calibration data and calibration curves can be used to check whether the currently running repair process is behaving as expected (for example on the basis of the defect type of the defect currently being processed and reference data recorded for such a defect type) in order thus to optimize and accelerate the further repair process. Conversely, such a comparison with available reference data/calibration curves may however also serve the purpose of examining the stability of the running method in relation to known or unknown influences. By way of example, if the current defect corresponds to a well examined and known defect type and if the repair behaviour of the current defect deviates significantly from the calibration curve or curves, this may be a sign that the running method and/or the device on which it runs is very susceptible to errors in relation to such influences. Optionally, suitable countermeasures may be adopted (for example, verifying the temperature, the vacuum, the electric charging of the mask, etc.), in order thus not to endanger the repair success on the present mask.

If reference process speeds are known for various materials, the method may also comprise drawing conclusions about the material composition of a defect from a repair behaviour of same.

In this case, the conclusions may be drawn taking account of the reference process speeds.

By way of example, using a constant repair dose, it is possible to carry out some repair steps or a plurality of repair steps on the defect, and conclusions about the process speed of the respective repair step can then be drawn, for example, from the respective change in the defect topology. This then allows derivation of a material composition of the defect (e.g. at the location of the respective repair step) by comparison with the known reference process speeds.

A further aspect is formed by a computer program with instructions which, when executed, prompt a device for repairing a defect of a mask for lithography, in particular an EUV mask, to carry out a method as described herein.

In this case, various aspects and features of the method described herein may have been combined in the program, and individual aspects may also remain unconsidered, provided these are dispensable for obtaining a desired result.

In particular, the computer program may comprise instructions which, upon execution, prompt the device for repairing the defect to automatically carry out the first repair step as calibration step on the defect using the first repair dose, automatically determine the influence of this calibration step on the topology of the defect, and automatically determine the second repair dose, at least in part on the basis of the determined influence of the calibration step and the first repair dose, in such a way that the second repair step can be carried out therewith in order to obtain the second defect topology.

A manual input of a user may therefore be dispensed with, which may accelerate the mask repair and/or reduce the susceptibility thereof to errors. This is also advantageous for an automation of the method.

A further aspect is moreover formed by a device for repairing a defect of a mask for lithography, in particular an EUV mask, the device being designed to carry out a method as described herein.

In this case, too, the device may be embodied such that various aspects and features of the method described herein, in the configuration running on said device, are combined with one another, and individual aspects of the described method may also remain unconsidered, provided these are dispensable for obtaining a desired result.

In this case, the device can comprise the following: means for carrying out a first repair step on the defect using a first repair dose, wherein the defect transitions from an initial topology to a first defect topology as a result, means for determining an influence of the first repair step on the topology of the defect, means for determining a second defect topology for the defect, which is intended to be achieved by way of a second repair step on the defect, and means for determining a second repair dose for the second repair step, at least in part on the basis of the determined influence of the first repair step on the topology of the defect and the second defect topology.

As already mentioned, the device may be a combined repair and analysis device in this case. In particular, this may allow the running method to run completely or at least predominantly under unchanging external conditions, in particular in a vacuum.

For example, the aforementioned means may be formed by a combination of a repair system marketed by the applicant with an atomic force microscope.

The device may moreover include a memory in which the aforementioned computer program is stored, and means for carrying out the instructions contained therein such that the device, upon execution of the instructions, automatically carries out the first repair step as calibration step on the defect using the first repair dose, automatically determines the influence of this calibration step on the topology of the defect, and automatically determines the second repair dose, at least in part on the basis of the determined influence of the calibration step and the first repair dose, in such a way that the second repair step can be carried out therewith in order to obtain the second defect topology.

The advantages of the option of such an automated procedure were already referred to and therefore reference is made here to the corresponding explanations.

Finally, attention is drawn to the following: Until now, the invention has been described and discussed predominantly within the context of repairing a mask defect, which represents an important application of the disclosed teaching. However, reference is made to the fact that the disclosed teaching is not restricted to this as a matter of principle but may also find use for (surface) processing of other objects used in the field of microelectronics, for example for changing and/or repairing structured wafer surfaces or surfaces of microchips, etc. These further application possibilities are therefore likewise always also encompassed by the teaching disclosed, even if not explicitly mentioned, provided these are not explicitly excluded, or physically or technically impossible.

BRIEF DESCRIPTION OF DRAWINGS

The following detailed description describes possible embodiments of the invention, with reference being made to the following figures.

DETAILED DESCRIPTION

Below, embodiments of the present invention are predominantly described with reference to repairing defects of lithographic masks. For the sake of completeness, reference is once again made to the fact that the invention is not restricted to this but may also be used, as a matter of principle, for different types of mask processing, or even more generally for the surface processing of other objects used in the field of microelectronics, for example for changing and/or repairing structured wafer surfaces or surfaces of microchips, etc. Even though reference is therefore predominantly made below to the specific application of repairing mask defects in order to keep the description clear and easily understandable, the other application options of the disclosed teaching nevertheless remain current for a person skilled in the art.

Further, reference is made to the fact that only individual embodiments of the invention are described in more detail below. However, a person skilled in the art will appreciate that the features and modification options described in association with these embodiments can also be modified even further and/or can be combined with one another in other combinations or sub-combination without this leading away from the scope of the present invention. Moreover, individual features or sub-features can also be omitted provided that they are dispensable for obtaining a desired result. In order to avoid unnecessary repetition, reference is therefore made to the remarks and explanations in the preceding sections, which also retain their validity for the detailed description which now follows below.

Figure 1:
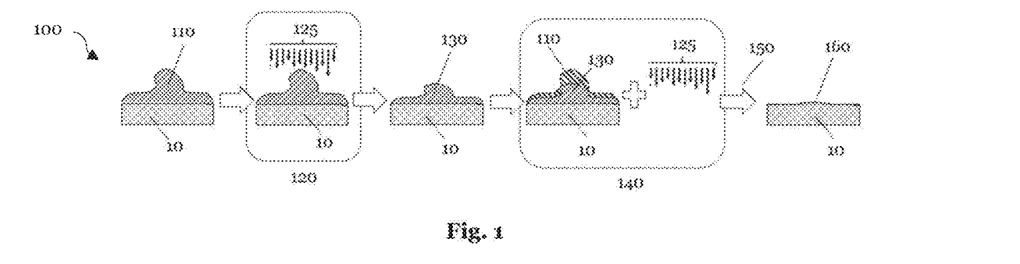
FIG. 1 shows an exemplary embodiment of the method described herein, in which excess absorber material is removed.

FIG. 1 schematically shows an embodiment 100 of the described method for repairing a defect of a mask 10 by etching away the excess absorber material.

The defect has an initial topology 110 at the start of the method 100. The initial topology 110 may already be known, for example from previous analyses of the mask 10, or it may initially be determined within the scope of the method 100, for example with the aid of an atomic force microscope.

The defect is subsequently processed in a first repair step 120 using the first repair dose (sometimes also only referred to as dose) 125. In the present case, the first repair step 120 is an etching process, that is to say one or more precursor gases, for example, are supplied to the area of the mask where the defect is situated, where said gases are made to react by irradiation with, e.g. a beam of energetic particles and etch away the absorber material. In the case shown here, the repair dose 125 varies dependent on position, that is to say that irradiation is implemented in accordance with what is known as a "dose map." In this case, this dose map may already be adjusted to a certain extent to the initial topology 110 of the defect.

After carrying out the first repair step 120, the topology, which in the present case is described and characterized by a spatially resolved height map of the defect, has changed and the defect now has a first defect topology 130. As will still be described below, the first repair step 120 in this case does not only serve the actual repair of the mask 10 but also acts as a calibration step for controlling and optimizing the further method sequence.

Thus, carrying out the first repair step 120 is followed by an analysis step 140 in which the influence of the first repair step 120 on the topology of the defect is examined. In the present case, this is implemented by virtue of the change in the topology of the defect, in particular the spatially dependent change in the height of the defect in this case, being determined by comparing the initial topology 110 with the first defect topology 130, which leads to a spatially resolved change profile of the topology in respect of the first repair step 120. Taking account of the utilized repair dose 125, it is possible to determine a type of resolved process speed of the etching procedure which is then used for the further method control.

Thus, once the analysis step 140 has been carried out, a second defect topology is initially determined, the intention being to obtain said second defect topology in a subsequent second repair step, as indicated by the arrow 150. By way of example, the second defect topology may already correspond to the ultimately desired repair success, corresponding in the present case to a removal of the excess absorber material down to the quartz level of the mask 10. The second defect topology may however also only represent an intermediate goal of the method, for example if the method has been designed for a plurality of iterations from the start.

On the basis of the information obtained in the analysis step 140, that is to say on the basis of the determined influence of the first repair step 120 on the topology of the defect, in particular the determined process speed of the first repair step 120, and the sought-after second defect topology, a second repair dose for the second repair step 150 is subsequently determined, and the second repair step 150 is carried out accordingly.

In the best-case scenario, carrying out this second repair step 150 leads exactly (or within certain acceptance intervals) to the sought-after success, i.e. the topology of the defect obtained thereby corresponds exactly to the sought-after second defect topology. As indicated in FIG. 1, the actual second defect topology 160 obtained when carrying out the second repair step 150 may also still deviate from the sought-after result, and so post-processing and/or further repair steps may optionally still be required.

Whether this is the case may be determined, for example, by verifying the defect topology 160 obtained following the second repair step 150, for example by comparison of the defect topology 160 with certain acceptance intervals or the like.

Should further processing be required, the above-described steps can be repeated iteratively until the desired repair success is obtained.

Figure 2:
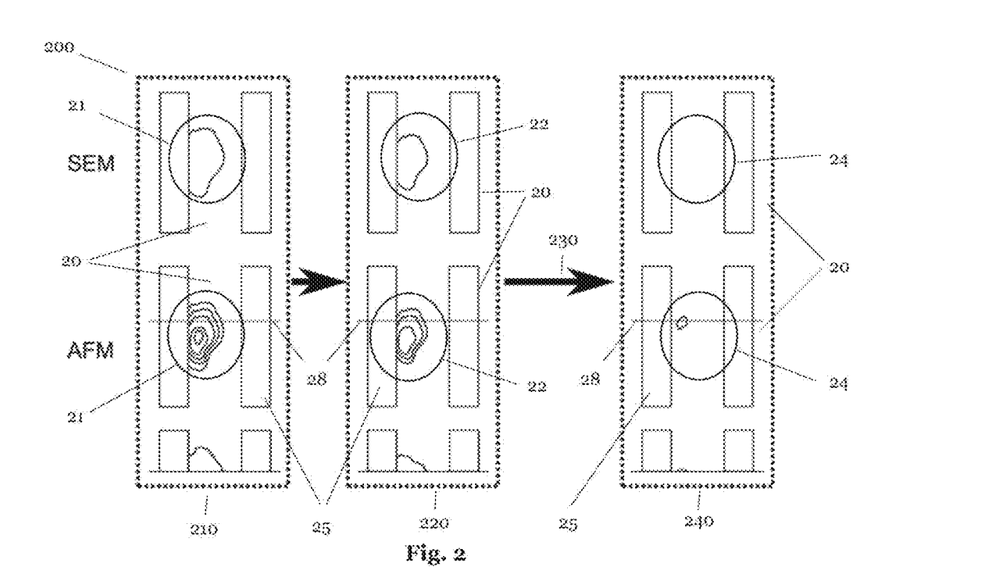
FIG. 2 shows the results of the application of an embodiment of the method described herein, onto a defect on a mask with a lines-and-spaces structure.

FIG. 2 shows a schematic illustration of the results and the procedure of a mask repair method 200 according to the teaching disclosed herein, using the mask 20 with a lines-and-spaces structure. Excess absorber material that was removed over the course of the method 200 is situated in one of the spaces.

In this case, the method 200 ran on a combined repair and analysis device under unchanging external conditions, specifically in a vacuum. The device comprised a scanning electron microscope (SEM) which served to carry out the repair steps by virtue of its electron beam serving to trigger the etching steps at the defect location under the supply of a suitable etching gas (or a gas mixture). At the same time, the SEM recorded images of the mask in surroundings of the defect site. These images recorded by the SEM are each shown at the top in the partial figures of FIG. 2 denoted by reference signs 210, 220 and 240.

For a more detailed analysis of the defect topology, use is further made of an atomic force microscope (AFM), the respective recordings of which are respectively shown in the middle and at the bottom of partial FIGS. 210, 220 and 240 of FIG. 2. In this case, the image in the centre respectively shows the mask 20 in a plan view (analogous to the images of the SEM) and with a height profile in the form of equidistant contours (analogous to a topographic hiking map). At the bottom of partial FIGS. 210, 220 and 240 of FIG. 2, a section through the corresponding height profile measured by the AFM along the cut line 28 is shown in each case.

Partial FIG. 210 shows the initial defect, as shown in an SEM image (at the top of partial FIG. 210) and in an AFM image (in the middle of partial FIG. 210, with contours). As already mentioned, a height profile was extracted (at the bottom of partial FIG. 210) from the AFM image along the horizontal line 28. In the region of the mask 20 indicated by reference sign 21, a defect in the form of excess absorber material is recognizable on one of the spaces, which is arranged between two lines 25.

A first repair step with a given dose map (repair dose), which served to calibrate the process speed, was carried out on this defect topology.

In this calibration step, the repair dose can be set not only by changing the current intensity of the electron beam but, alternatively or additionally, by virtue of varying the number of times the electron beam strikes a certain processing spot within a repair step. However, other options for controlling and changing the repair dose are also expressly comprised by the present teaching.

The situation as depicted in the central partial figure of FIG. 2, denoted by reference sign 220, arose after carrying out this calibration step/1st repair step: In the region of the mask 20 indicated by reference sign 22, it is still possible to recognize a (weak) defect in the form of excess absorber material in the relevant space.

Once again recording one or more AFM images (see the middle and bottom of partial FIG. 220) allowed the change in the defect topology by way of the first repair dose to be determined in spatially resolved fashion. Then, this change, the dose map used in the calibration step and a target topology in respect of the subsequent second repair step were used to calculate a new dose map for the purposes of obtaining this target topology. This dose map was then applied to the defect in a further repair step, indicated in FIG. 2 by the arrow 230.

In this respect, reference is made to the fact that the processing indicated by the arrow 230 can also comprise a plurality of analysis and repair steps, with the dose map for each step being able to be calculated from the preceding dose map or maps, the preceding change or changes in topology and a respective or common target topology specified as the repair target overall.

In this case, it is by all means possible that the method 200 is designed to run over a plurality of iterations, that is to say a defect topology sought-after for a certain repair step need not necessarily correspond to the ultimately desired repair success, for example the complete removal of the excess absorber material. Instead, even after the first repair step has taken place, a given repair step may serve in dedicated fashion for the further fine calibration and fine tuning of the repair method 200 such that the information obtained in the first repair step and in this repair step (and optionally information from even further repair steps that serve the calibration) can ultimately be used in the subsequent repair step or steps in order to obtain an extremely accurate repair of the defect of the mask 20. By way of example, this can avoid over-etching of the defect.

To repeat this again, a respective sought-after defect topology (e.g. the second defect topology and/or the third defect topology and/or the fourth defect topology, etc., in the case of an iterative method sequence) therefore need not necessarily always already correspond to the desired end result of the repair process 200 (although this naturally can also be the case), but can also merely represent an intermediate goal of the method. In such a case—and this applies very generally to the teaching disclosed herein and not only to the currently described exemplary embodiment 200—the intermediate topology of the defect sought-after in a repair step can also be specified to a less detailed extent than this may be the case, for example, for the sought-after end result of the repair process. By way of example, the sought-after intermediate topology of the defect may only be specified to the extent that no more than a certain percentage of the remaining defect dimension (e.g. defect height and/or defect width) should be removed (or deposited in the case of a deposition process), in order to avoid damage to the mask and/or an "over repair." By way of example, it may be possible to specify that the sought-after defect topology should attain no more than 50%, or no more than 30%, or else no more than 15% of the outstanding repair success. Expressed differently, a repair step (even after the first repair step) can be carried out in dedicated fashion as a (further) calibration step, for example in order to better understand and calibrate the dynamics of the repair process but at the same time avoid damage to the mask and/or avoid an "over repair," as has happened here as well.

In conjunction with the respectively utilized dose map, spatially resolved measurements of the change in the height of the defect in each repair step, carried out by the AFM, can determine a spatially resolved process speed of the etching process in this case. Further in conjunction with the still remaining residual height of the defect, which likewise can be determined in spatially resolved fashion using the AFM, it is then possible in an extrapolation step to determine a new dose map or repair dose (e.g. number of loops) in order to obtain the defect topology respectively desired in the following step and/or ultimately desired.

The right partial FIG. 240 of FIG. 2 shows the defect (or what still remains therefrom) after the second repair step (and the optional further repair steps) 230. The combination of SEM and AFM images served to verify the repair success.

In the case shown here, it is evident from the two AFM images (in the middle and at the bottom of the partial FIG. 240 of FIG. 2) that a residue of the defect was still present, which could have been removed by a further repair step. However, should the topology of the residue be within the specification limits for a successful repair, this repair can already be considered successfully completed even in this case. In particular, providing the remaining residue is below a certain threshold (e.g. not leading to a wafer defect during the actual irradiation process of the wafer with the aid of the mask 20), it may remain on the mask 20.

Figure 3:
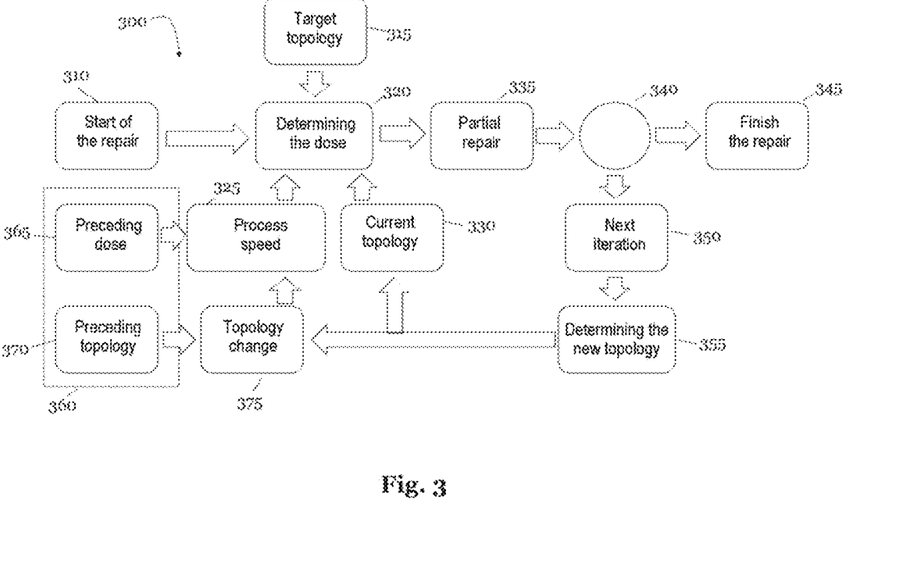
FIG. 3 shows conceivable method sequences for a possible implementation of the method described herein, which can be carried out by means of components of a combined analysis and repair device.

FIG. 3 shows conceivable method sequences 300 for a possible implementation of the method described herein, which can be carried out for example by use of components of a combined analysis and repair device, which can be realized with a combination of a repair system (e.g. with an SEM) and an analysis system (e.g. with an AFM).

A determination of the dose or the repair dose 320 can be carried out on the mask to be processed at the beginning of the repair 310. In this case, the target topology 315, the current topology 330 and the process speed 325 may influence the determination of the dose. In this case, the process speed 325 can be set by a user input or specified as a standard value by the system (e.g. on the basis of a reference value for a similar repair, a calibration curve, etc.), particularly in a first iteration step. However, particularly in the case of a second or further iteration step, the process speed can also be determined or known from measuring one (or more) preceding topology changes 375 and one (or more) preceding dose (doses) 365.

In this case, the dose can be specified or defined as the number of times the electron beam of an SEM strikes a processing point during the repair step. However, other definitions of the dose are likewise conceivable.

Then, the determined dose 320 can be applied in a first (partial) repair step 335 for repairing a defect, it being possible, in particular, to use an SEM, which can be part of the utilized repair device, to this end. In this case, it is possible to repair the mask in one step or in a plurality of (e.g. iterative) steps. The first (partial) repair step 335 can also be carried out as a calibration step, that is to say the first defect topology to be obtained and, accordingly, the first dose can be chosen and determined relatively "conservatively" in order to avoid damage to the mask or an "over repair." Optionally, post-processing steps can be implemented after the repair step has been carried out.

A decision as to whether the repair should be completed 345 or whether there should be a next iteration 350 of the repair procedure can be made in a next step 340.

Should there be a further iteration 350 of the repair procedure, the new topology 355 or the new defect height of the mask defect can subsequently be determined. However, it is also possible to determine the new topology if there should be no further iteration 350, for example in order to check the end result of the repair. Should counter-intuitively the latter not be as desired, it would also be possible to carry out an even further iteration 350 and proceed accordingly.

The new topology 355 can be stored as (new) current topology 330. On the basis of the new topology 355 and the information from one or more preceding iterations 360, e.g. a preceding topology 370, it is possible to determine a topology change 375 which has been obtained by the first iteration step or repair step. The information about the topology change 375 obtained thus can be used in isolation or be used in conjunction with the preceding dose 365 (of one or more preceding iteration or repair steps) to determine a (new) process speed 325.

Now, once again in step 320, it is possible to determine the dose for the further (partial) repair procedure to be carried out. This can be implemented on the basis of the (new) process speed 325, the (new) current topology 330 and the target topology 315. Reference data from calibration curves, etc., stored in the system and/or dynamically created, can be considered at this point.

Then, the next repair step 335 can be carried out with the dose determined thus and further (partial) repair steps 335 can optionally be implemented.

In this way, the method can be continued until the desired repair success or the target topology 315 sets in, possibly with the inclusion of an end verification of the repair result, for example using an AFM and/or SEM.

The components of the repair device can in this case be implemented at least in part in hardware and in software, with combinations of hardware- and software-type implementations naturally being possible.

A further advantageous implementation of the method can further be of the form that, for example following the determination of the initial topology of the defect, a target topology is specified as sought-after end result of the repair process (either manually or automatically) and the method then runs in (largely) automated fashion on a system or a device. To this end, the system or the device can be designed to choose suitable process control without manual intervention, for example on the basis of reference curves relating to a class of defects that are similar to or the same as the present defect, and in particular to make a decision as to the number of iterations that initially appears most advantageous for the repair of the present defect. The intermediate topologies to be obtained can be determined automatically on the basis of this number. Then, as described above, the system can automatically iterate through the repair process, it by all means being possible that the number of iterations originally sought after by the system is insufficient (or too large) to obtain the desired repair success. Then, the system can automatically carry out further repair steps (or omit steps no longer required) or the system initially interrupts the repair process to await further user inputs. In any case, the system can calibrate itself during the iteration through the repair process, which can represent a particular advantage of the method and system described.

In some implementations, the system or device for processing of data described above, such as determining one or more repair doses, determining the influence of one or more repair steps on the topology of the defect, and determining one or more defect topologies for the defect, can be achieved by using one or more computers executing one or more computer programs that include a plurality of instructions according to the principles described above. The one or more computers can include one or more data processors for processing data, one or more storage devices for storing data, such as one or more databases, and/or one or more computer programs including instructions that when executed by the computer cause the computer to carry out the processes. The computer can include one or more input devices, such as a keyboard, a mouse, a touchpad, and/or a voice command input module, and one or more output devices, such as a display, and/or an audio speaker.

In some implementations, the computer can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the computer can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, solid state drives, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM, DVD-ROM, and/or Blu-ray discs.

In some implementations, the processes that involve processing of data, such as processes for determining one or more repair doses, determining the influence of one or more repair steps on the topology of the defect, and determining one or more defect topologies for the defect, can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions can be performed on a special purpose computer, or using special-purpose hardware, such as coprocessors. The software can be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system can also be considered to be implemented as a computer-readable storage medium, configured with a computer program, where the storage medium so configured causes a computer system to operate in a specific and predefined manner to perform the functions described herein.

What is claimed is:

1. A method for repairing a defect of a mask for lithography, in particular of an EUV mask, comprising:
   a. carrying out a first repair step on the defect using a first repair dose, wherein the defect transitions from an initial topology to a first defect topology as a result;
   b. determining an influence of the first repair step on the topology of the defect, comprising a determination of a change in the topology of the defect which is caused by carrying out the first repair step, including a comparison of the first defect topology with the initial topology;
   c. determining a second defect topology for the defect, which is intended to be achieved by way of a second repair step on the defect; and
   d. determining a second repair dose for the second repair step, at least in part on the basis of the determined influence of the first repair step on the topology of the defect and the second defect topology, wherein the determined influence is based at least in part on the comparison of the first defect topology with the initial topology, and the second repair dose is different from the first repair dose;
   wherein the topology of the defect comprises a characteristic of the defect dependent on a position on the mask.

2. The method of claim 1, further comprising:
   e. carrying out the second repair step using the second repair dose.

3. The method of claim 1, wherein the first repair step is carried out as a calibration step in which less than 50% of a desired final repair success are obtained, or wherein a first repair dose is determined for the first repair step, said first repair dose aiming to obtain more than 50% of a desired final repair success.

4. The method of claim 1, wherein step b. of determining the influence of the first repair step on the topology of the defect comprises determining a first process speed of the first repair step, at least in part on the basis of the determined change in the topology of the defect and the first repair dose.

5. The method of claim 1, wherein the topology of the defect comprises a height of the defect dependent on a position on the mask.

6. The method of claim 5, wherein the topology of the defect further comprises one or more of the following information items: a lateral extent of the defect, a three-dimensional structure of the defect.

7. The method of claim 1, wherein step d. of determining the second repair dose for the second repair step further takes account of one or more calibration curves for different defect types, which curves allow a repair behaviour of the defect to be estimated.

8. The method of claim 7, wherein the one or more calibration curves were created manually or automatically during the current iteration and/or one or more previous iterations of the method.

9. The method of claim 4, further comprising:
  e. carrying out the second repair step using the second repair dose;
  wherein the defect comprises a plurality of material layers and wherein:
    the first repair step using the first repair dose is carried out on a first material layer which includes a first material,
    the second repair step using the second repair dose is carried out on a second material layer which includes a second material that differs from the first material,
    the first process speed of the first repair step is determined in relation to the first material, and
    the determination of the second repair dose further includes taking account of a thickness of the second material layer and a process selectivity of the second repair step on the second material in relation to the first repair step on the first material.

10. The method of claim 1, wherein the second defect topology represents the desired end topology.

11. The method of claim 2, wherein the second defect topology represents an intermediate goal of the method and wherein the method iteratively runs through steps b. to e. until a desired end topology of the defect is obtained.

12. The method of claim 10, further comprising a verification of the obtained end topology.

13. The method of claim 1, wherein the first repair dose and/or the second repair dose varies dependent on position.

14. The method of claim 1, wherein the first repair step and/or the second repair step comprises an etching process and/or a deposition process.

15. The method of claim 4, wherein the first process speed is determined dependent on position.

16. The method of claim 1, wherein the method runs under unchanging external conditions, in particular in a vacuum.

17. The method of claim 1, wherein the method runs on a combined repair and analysis device.

18. The method of claim 1, wherein the defect corresponds to a known defect type for which one or more calibration curves are known and wherein the method further comprises using a repair behaviour of the defect to draw conclusions about a stability of the method and/or a device on which the method runs.

19. The method of claim 1, wherein reference process speeds are known for various materials and wherein the method further comprises using a repair behaviour of the defect to draw conclusions about its material composition.

20. A computer-readable medium storing a computer program comprising instructions which, upon execution, prompt a device for repairing a defect of a mask for lithography to carry out the method of claim 1.

21. The computer-readable medium of claim 20, further comprising instructions which, upon execution, prompt the device for repairing the defect to automatically carry out the first repair step as calibration step on the defect using the first repair dose, automatically determine the influence of this calibration step on the topology of the defect, and automatically determine the second repair dose, at least in part on the basis of the determined influence of the calibration step and the first repair dose, in such a way that the second repair step can be carried out therewith in order to obtain the second defect topology.

22. A device for repairing a defect of a mask for lithography, in particular an EUV mask, wherein the device is designed to carry out the method of claim 1.

23. The device of claim 22, the device comprising the following:
  a. means for carrying out a first repair step on the defect using a first repair dose, wherein the defect transitions from an initial topology to a first defect topology as a result;
  b. means for determining an influence of the first repair step on the topology of the defect;
  c. means for determining a second defect topology for the defect, which is intended to be achieved by way of a second repair step on the defect; and
  d. means for determining a second repair dose for the second repair step, at least in part on the basis of the determined influence of the first repair step on the topology of the defect and the second defect topology;
    wherein the topology of the defect comprises a characteristic of the defect dependent on a position on the mask.

24. The device of claim 22, further including a memory in which the computer program of claim 21 is stored, and means for carrying out the instructions contained therein such that the device for repairing the defect, upon execution of the instructions, automatically carries out the first repair step as calibration step on the defect using the first repair dose, automatically determines the influence of this calibration step on the topology of the defect, and automatically determines the second repair dose, at least in part on the basis of the determined influence of the calibration step and the first repair dose, in such a way that the second repair step can be carried out therewith in order to obtain the second defect topology.

25. The method of claim 1, wherein the first repair step comprises a deposition process, and the method comprises:
  determining an influence of the deposition process on the topology of the defect, and
  determining a second repair dose for the second repair step, at least in part on the basis of the determined influence of the deposition process on the topology of the defect and the second defect topology.

26. A method for repairing a defect of a mask for lithography, the method comprising:

carrying out a plurality of repair steps on the defect with each repair step using a corresponding repair dose, the plurality of repair steps including an i-th repair step on the defect using an i-th repair dose, $1 \leq i$, wherein the defect transitions from an (i−1)-th topology to an i-th defect topology as a result, and the 0-th topology corresponds to an initial topology;

wherein carrying out the plurality of repair steps includes:
  determining an influence of the i-th repair step on the topology of the defect;
  determining an (i+1)-th defect topology for the defect that is intended to be achieved by an (i+1)-th repair step on the defect; and
  determining an (i+1)-th repair dose for the (i+1)-th repair step based at least in part on the determined influence of one or more of the first repair step to the i-th repair step on the topology of the defect and the (i+1)-th defect topology,
  wherein when carrying out the plurality of repair steps at least one of the repair doses is different from the other repair dose or doses;
wherein the topology of the defect comprises a characteristic of the defect dependent on a position on the mask.

27. The method of claim 26 wherein the mask comprises an EUV mask.

28. The method of claim 26 wherein carrying out the plurality of repair steps comprises carrying out N repair steps, N>2:

wherein during carrying out the N repair steps, the first repair dose to the (N-1)-th repair dose are the same, and the N-th repair dose is different from the first to (N-1)-th repair doses.

29. The method of claim 26 wherein carrying out the plurality of repair steps comprises carrying out four repair steps:
  wherein during carrying out the four repair steps, the first repair dose to the third repair dose are the same, and the fourth repair dose is different from the first to third repair doses.

30. The method of claim 26 wherein determining an (i+1)-th repair dose comprises determining an (i+1)-th repair dose for the (i+1)-th repair step based at least in part on an averaged or weighted influence of two or more of the first repair step to the i-th repair step on the topology of the defect and the (i+1)-th defect topology.

31. The method of claim 26 wherein a third repair dose is determined based at least in part on an averaged or weighted influence of the first and second repair steps on the topology of the defect and the third defect topology.

32. The method of claim 26 wherein a fourth repair dose is determined based at least in part on an averaged or weighted influence of at least one of (i) the first and second repair steps, (ii) the second and third repair steps, (iii) the first and third repair steps, or (iv) the first, second, and third repair steps on the topology of the defect and the fourth defect topology.

* * * * *